United States Patent [19]

Nellissen et al.

[11] Patent Number: 5,875,531
[45] Date of Patent: Mar. 2, 1999

[54] METHOD OF MANUFACTURING AN ELECTRONIC MULTILAYER COMPONENT

[75] Inventors: Antonius J. M. Nellissen; Erik C. E. Van Grunsven, both of Eindhoven, Netherlands

[73] Assignee: U.S. Philips Corporation, New York, N.Y.

[21] Appl. No.: 622,509

[22] Filed: Mar. 25, 1996

[30]       Foreign Application Priority Data

Mar. 27, 1995 [EP] European Pat. Off. ............... 95200751
Feb. 16, 1996 [EP] European Pat. Off. ............... 96200395

[51] Int. Cl.$^6$ ........................................................ H01G 7/00
[52] U.S. Cl. ........................ 29/25.35; 29/25.42; 29/620; 427/79; 427/100
[58] Field of Search ................................. 29/25.42, 25.35, 29/620; 427/79, 100

[56]                References Cited

U.S. PATENT DOCUMENTS 3,326,718  6/1967  Dill .......................................... 117/212

Primary Examiner—Timothy V. Eley
Assistant Examiner—Benjamin M. Halpern
Attorney, Agent, or Firm—Norman N. Spain

[57]                  ABSTRACT

A method of manufacturing a plurality of electronic multilayer component search of which alternately stacked electrically conductive and insulating layers alternately connected to opposite edges of the component, which method comprises: providing a substrate having a face endowed with a regular pattern of substantially parallel elongated protrusions separated by valleys; providing a first and a second flux of electrically conductive material in a direction subtending an angle of less than 90 with the substrate face and extending substantially parallel to the surface protrusions, and covering the thus-formed electrically conductive layers with intervening electrically insulating layers, the first and second fluxes having substantially oppositely directed in-plane components; providing said first and second fluxes with intervening insulating layers in an alternate manner as often as desired; dividing the substrate into strips, each including a protrusion, by severing the substrate along a series of planes, each of which plane extends along a valley in a direction substantially parallel to the protrusions; and providing electrically conductive material upon each resulting exposed side faces of the strips so as to provide a mutual electrical contact between the electrically conductive layers terminating in that exposed side face.

16 Claims, 5 Drawing Sheets

METHOD OF MANUFACTURING AN ELECTRONIC MULTILAYER COMPONENT

BACKGROUND OF THE INVENTION

1. Field of the Invention

The invention relates to a method of manufacturing a plurality of electronic multilayer components, each of which comprises alternately stacked electrically conductive and electrically insulating layers, the electrically conductive layers being electrically connected in a periodically alternate arrangement to substantially opposite edges of the multilayer component. Such components may receive application as multilayer capacitors or multilayer actuators, for example.

2. Discussion of the Related Art

A method as described in the opening paragraph is known from U.S. Pat. No. 3,326,718, in which layers of electrically conductive and electrically insulating material are alternately deposited onto a flat substrate through an apertured mask, the planes of the substrate and mask being mutually parallel. In the case of the insulating material, the depository flux is directed at right angles to the plane of the mask, so that it passes through the aperture in a perpendicular direction. However, in the case of the conductive material, the depository flux is directed through the aperture at a non-perpendicular angle $\alpha$ with respect to the substrate surface. Moreover, although consecutive conductive layers are deposited using the same value of $\alpha$, the depository fluxes for such consecutive layers are not mutually parallel, but instead arise from sources located at diametrically opposite sides of the aperture. As a result, consecutive conductive layers demonstrate only a partial mutual overlap, as illustrated in FIG. 2 of the cited U.S. patent. At the same time, as shown in FIG. 4 of that patent, conductive layers (56, 56') having an odd ordinal number make mutual electrical contact at one side (62) of the component, and conductive layers (68, 68') having an even ordinal number make mutual electrical contact at an other side (76) of the component.

The known method has a number of disadvantages. In particular, the number of conductive layers which can be deposited in this manner is severely limited. This is because, as the stack of layers on the substrate increases in height, that stack will itself begin to partially eclipse the depository fluxes of conductive material, and will eventually prevent the desired mutual contact of every second conductive layer at the edge of the component. In addition, material from the depository fluxes will accumulate on the apertured mask, and particularly along the edges of the apertures, causing a relatively rapid deterioration in mask definition. This is a particular problem when manufacturing large numbers of very small components (lateral dimensions of the order of 1 mm) on a large wafer, since the dimensional deterioration in the apertures may then constitute a substantial fraction of the component's lateral dimensions. In such cases, regular replacement of the mask will be required.

SUMMARY OF THE INVENTION

It is an object of the invention to provide an alternative method of manufacturing electronic multilayer components. It is a specific object of the invention that such a method should allow the provision of a great plurality of layers in such multilayer components. In particular, it is an object of the invention that such a method should not require the use of an apertured mask during deposition of the components.

These and other objects are achieved in a method as stated in the opening paragraph, which is characterised in that it successively comprises the following steps:

(a) providing a substrate which is endowed on one face with a regular pattern of substantially parallel elongated surface protrusions separated by intervening valleys;

(b) providing a flux of electrically conductive material in a direction $D_1$ subtending an angle of less than 90° with the substrate face and extending substantially perpendicular to the surface protrusions, and subsequently covering the electrically conductive layer thus formed with an electrically insulating layer;

(c) providing a flux of electrically conductive material in a direction $D_2$ subtending an angle of less than 90° with the substrate face and having an in-plane component which is directed substantially opposite to the in-plane component of direction $D_1$, and subsequently covering the electrically conducting layer thus formed with an electrically insulating layer;

(d) repeating steps (b) and (c), in alternation, as often as desired, and finishing with step (b) or (c), as desired;

(e) dividing the substrate into strips, each including a surface protrusion, by severing the substrate along a series of planes, each plane extending along a valley in a direction substantially parallel to the surface protrusions, each strip thus acquiring an exposed side face running along each of the two planes defining the strip;

(f) providing electrically conductive material upon each exposed side face, so as to provide mutual electrical contact between the electrically conductive layers terminating in that exposed side face.

The surface protrusions referred to in step (a), in combination with the non-perpendicular depository direction specified in steps (b) and (c), allow the exploitation of shadow effects during deposition of the conductive layers, without reliance on an apertured mask.

A significant advantage of the inventive method is that a great plurality of layers (as many as several hundred) can be provided in each multilayer component, without the occurrence of the undesired eclipsing effects referred to hereabove with respect to the cited U.S. patent.

The surface protrusions on the face of the employed substrate (step (a)) can be provided by using a number of different techniques. For example, such protrusions may be created by depositing material through a patterned mask onto a planar substrate, or by employing a pressing or injection moulding technique in combination with an impressible substrate material, such as a polymer or ceramic material. However, particularly satisfactory results are achieved when the surface protrusions are provided by patternwise selective removal of substrate material with the aid of an etching technique. In specific exemplary embodiments of such a technique, suitable valleys can be etched into any of the following substrates:

- a smooth glass plate, using a patterned mask in combination with Reactive Ion Etching or powder blasting;
- a photo-sensitive glass plate, using a combination of lithography, actinic irradiation and wet etching;
- a Si(110) wafer, exploiting selective etching along crystal planes using aqueous KOH (potassium hydroxide);
- a $SiO_2$ or $Si_3N_4$ layer provided on a Si wafer, using a mask in combination with plasma etching.

This list is given by way of example only, and is by no means exhaustive.

It so desired, one or more layers of material may be deposited on the face of the substrate before step (b) is enacted. Such layers may, for example, serve the purpose of affording electrical insulation, improving adhesion, etc.

A suitable deposition technique for provision of the electrically conductive layers in the inventive method (steps (b) and (c)) is, for example, physical vapor deposition (collimated sputtering or evaporation), since this is readily compatible with the requirement to controllably deposit material in a particular direction. It can also be used to provide the electrically insulating layers, in which case chemical vapour deposition (CVD) is also to be considered as a suitable depository method. These techniques lend themselves to the deposition both of conductive materials (such as metals) and insulating materials (such as certain oxides and nitrides). In particular, an insulating material such as $SiO_2$ (for example) may be conveniently deposited using either a quartz target in vacuum or a Si target in an oxygen atmosphere.

A considerable advantage of the inventive method is that it can be performed using a very simple deposition geometry. For example, by affixing the substrate to a rotatable holder, the entire deposition procedure can be performed using only two sources, placed side by side (as illustrated in FIG. 12, for example). In this scenario, one of the two sources contains electrically conductive material, whereas the other contains electrically insulating material. When depositing the latter, the substrate holder is continually rotated, thereby ensuring complete depository coverage of one side of the substrate. When depositing the former, on the other hand, the substrate holder is kept fixed, but can be rotated through a fixed angle between depositions of consecutive conductive layers. Such an arrangement obviates the wide distribution of deposition sources (20, 30, 40) depicted in FIG. 1 of the cited U.S. patent.

An alternative to rotating the substrate during deposition of the electrically insulating material is simply to employ a plurality of depository fluxes (of electrically insulating material), which may be directed at the substrate from different angles.

It should be further noted that the electrically conductive material need not be the same for all conductive layers, and that the electrically insulating material may also be different for different insulating layers, if so desired. In addition, it is not necessary to use the same value of θ for all the conductive layers, and the thicknesses of the various conductive or insulating layers may also mutually differ.

If so desired, a blanketing layer of insulating material may be provided upon the multilayer structure before enaction of step (e). The purpose of such a blanketing layer may be, for example, to fill in the periodic depressions (valleys) in the multilayer structure, so as to provide a substantially flat top face (whereby the final components will have a smooth and regular geometry). Such a blanketing layer may, for example, comprise a glass-based paste which is raked onto the exposed face of the multilayer structure, and is then hardened. Alternatively, it may comprise a spin-coated resin or extruded plastic layer, for example.

The severing step (e) can be enacted using, for example, a sawing, dicing or laser scribing technique, known per se in the art. After performing step (e), each conductive layer with an odd ordinal number will terminate in an exposed side face running along a first elongated edge of each strip, whereas each conductive layer with an even ordinal number will terminate in an exposed side face running along the second (opposite) elongated edge of each strip. The conductive layers terminating in a given exposed side face will, of course, be mutually separated by interposed insulating layers.

The provision of electrical contacts (step (f)) upon the exposed side faces of the strips resulting from step (e) may, for example, be performed by dipping each such exposed side face into a metallisation bath of conductive ink (e.g. silver-palladium ink). In this manner, a metallic "cap" is formed on top of each exposed side face. If so desired, this cap may be subsequently thickened using an electroplating procedure, for example.

As an alternative to the dipping bath discussed in the previous paragraph, the required electrical contacts may be provided by physical vapour deposition (sputtering or evaporation) of metallic material onto each exposed side face, or by brushing or spraying conductive ink or molten metal onto that side face.

If so desired, the elongated strips thus obtained may be divided into smaller components by severing them at (regular or irregular) intervals along their length. This may be done using a sawing or scribing technique, for example.

BRIEF DESCRIPTION OF THE DRAWINGS

The invention and its attendant advantages will be further described with the aid of exemplary embodiments and the accompanying schematic drawings, which are not to scale, whereby.

DETAILED DESCRIPTION OF THE PREFERRED EMBODIMENTS

Embodiment 1

FIGS. 1–11 schematically depict various aspects of a particular embodiment of the current inventive method of manufacturing a plurality of electronic multilayer components. Corresponding features in the various Figures are denoted by the same reference symbols.

Figure 1:
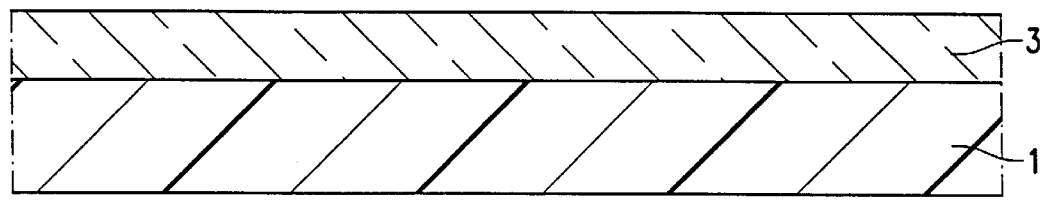
FIG. 1 is a cross-sectional view of a composite substrate prior to its subjection to a selective etching procedure.
Figure 2:
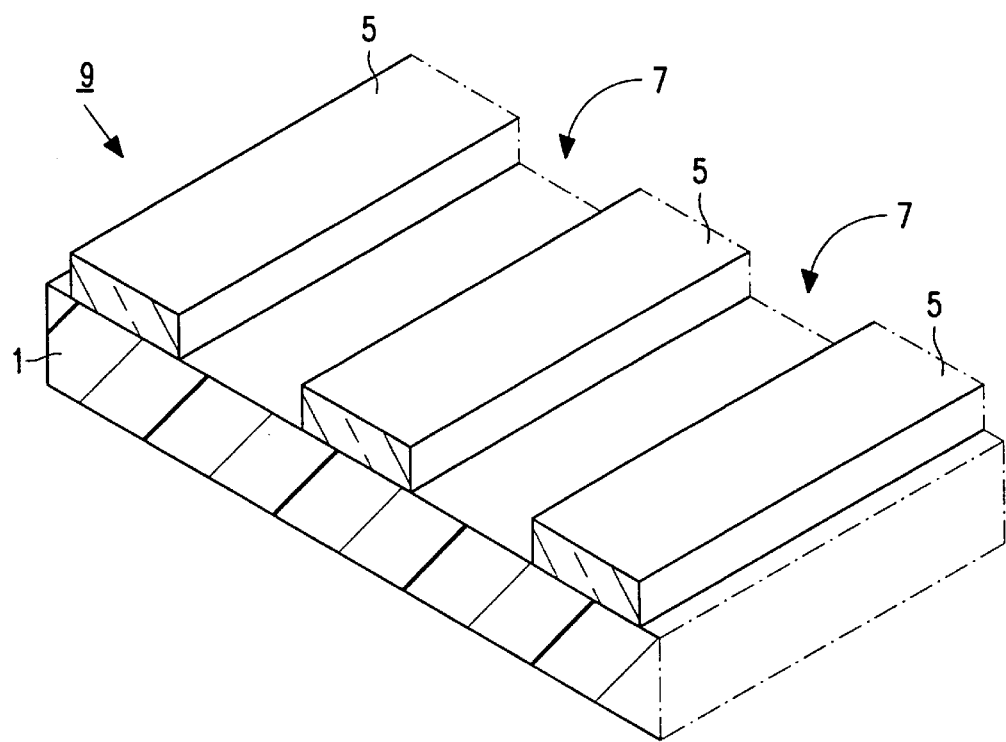
FIG. 2 is a perspective view of the composite structure of FIG. 1 after the creation therein of a regular pattern of substantially parallel elongated surface protrusions separated by intervening valleys.

FIG. 1 is a cross-sectional view of a Si base 1 which has been provided with a uniform layer 3 of $SiO_2$. The base 1 may alternatively comprise $Al_2O_3$, for example. The layer 3 is provided using Plasma Chemical Vapour Deposition (PCVD), and has a thickness of approximately 25 µm, whereas the Si base 1 has a thickness of approximately 0.5 mm.

Using photolithographic techniques, the exposed planar surface of the layer 3 is provided with an etch mask in the form of a regular pattern of elongated, parallel, equidistant bands. The open areas between these bands are of elongated rectangular form, with a typical width of the order of 1 mm.

With the aid of Reactive Ion Etching or wet etching, the unmasked areas of the layer 3 are etched to a depth of about 25 μm. As a result, the base 1 becomes endowed with a pattern of parallel, elongated surface protrusions 5 and intervening valleys 7, as shown in perspective view in FIG. 2. The mutual separation of the protrusions 5 is approximately 1 mm, whereas their length is of the order of 100 mm. The resulting patterned substrate 9 is suitable for use in the inventive method, as hereinafter elucidated.

Before enacting step (b), a thin blanketing layer of an electrically insulating material (e.g. $SiO_2$) can be provided over the protrusions 5 and valleys 7, if so desired. Such a layer is not depicted here.

Figure 3:
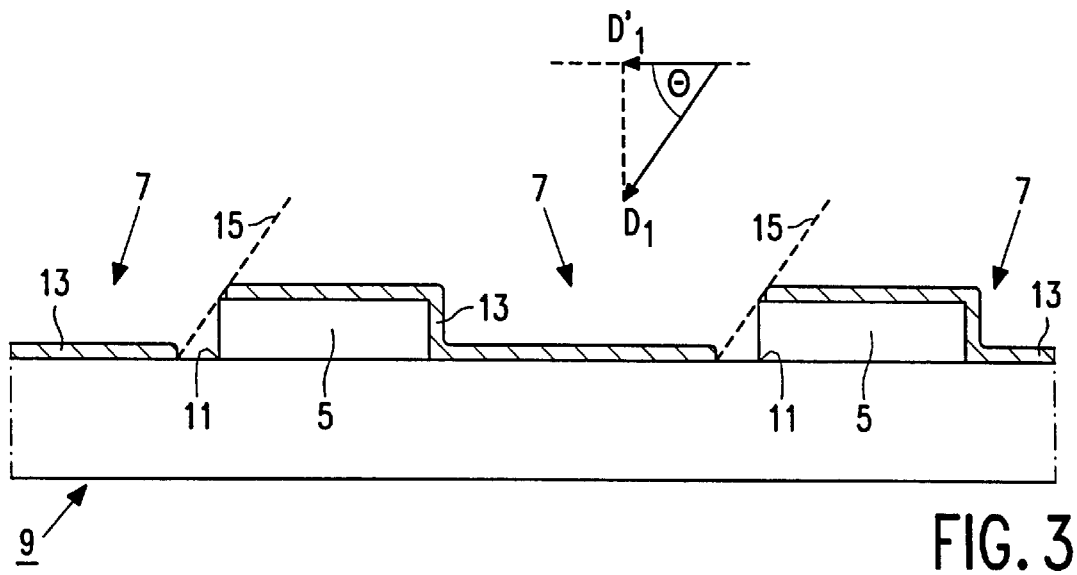
FIG. 3 is an elevational view of the substrate of FIG. 2, subsequent to the non-perpendicular deposition thereupon of a first electrically conductive layer.

In FIG. 3, the substrate 9 has been provided with a first layer 13 of electrically conductive material (e.g. a metal such as Al, Cu or Ta) using physical vapour deposition. The layer 13 is deposited from a direction $D_1$ (parallel to the dashed lines 15) which subtends a non-perpendicular acute angle θ (here approximately 50°) with the plane of the substrate 9, and has an in-plane component $D_1'$. The direction $D_1$ extends perpendicular to the edges 11 of the protrusions 5. As a result of shadow effects, the layer 13 is not continuous, but is interrupted at regular intervals in the lee of the protrusions 5. A suitable thickness for the layer 13 is of the order of 100 nm.

Figure 4:
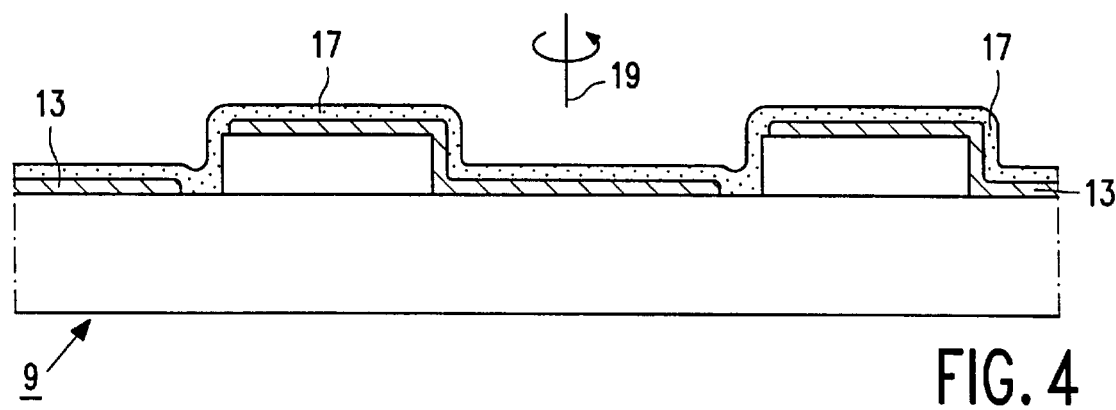
FIG. 4 illustrates the structure of FIG. 3 subsequent to its coverage with a first electrically insulating layer.

FIG. 4 shows the structure of FIG. 3 after the provision thereupon of a layer 17 of an electrically insulating (dielectric) material, such as $SiO_2$, $Al_2O_3$, $Si_3N_4$ or $Ta_2O_5$. In contrast to the previous layer 13, the layer 17 is continuous. Such continuity may be obtained inter alia by depositing the insulating material from the direction $D_1$ depicted in FIG. 3, while simultaneously rotating the substrate 9 about an axis 19 perpendicular to its plane. A suitable thickness for the layer 17 is of the order of 100 nm.

Figure 5:
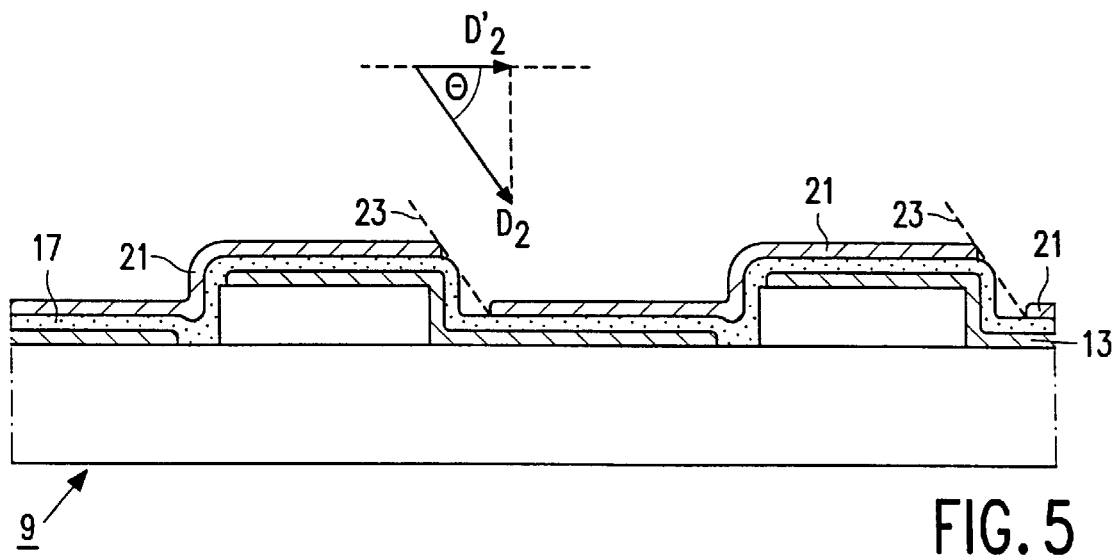
FIG. 5 shows the structure of FIG. 4 subsequent to the non-perpendicular deposition thereupon of a second electrically conductive layer.

In FIG. 5, the substrate 9 has been provided with a second layer 21 of electrically conductive material. The layer 21 is deposited from a direction $D_2$ (parallel to the dashed lines 23) which again subtends a non-perpendicular acute angle θ with the plane of the substrate 9, and has an in-plane component $D_2'$. The direction $D_2$ is coplanar with the direction $D_1$ in FIG. 3, so that $D_2'$ is anti-parallel to $D_1'$.

Figure 6:
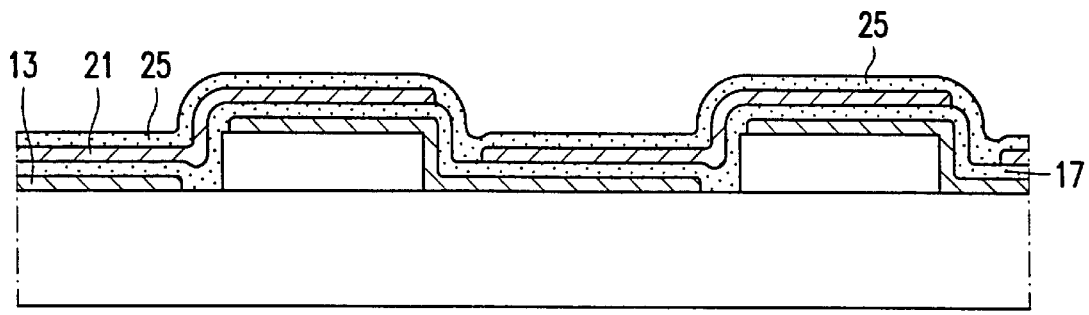
FIG. 6 depicts the structure of FIG. 5 subsequent to its coverage with a second electrically insulating layer.

Once the layer 21 has been deposited, it is covered by a layer 25 of electrically insulating material, as shown in FIG. 6. This can, for example, be done in analogy to the procedure described hereabove with reference to FIG. 4.

Figure 7:
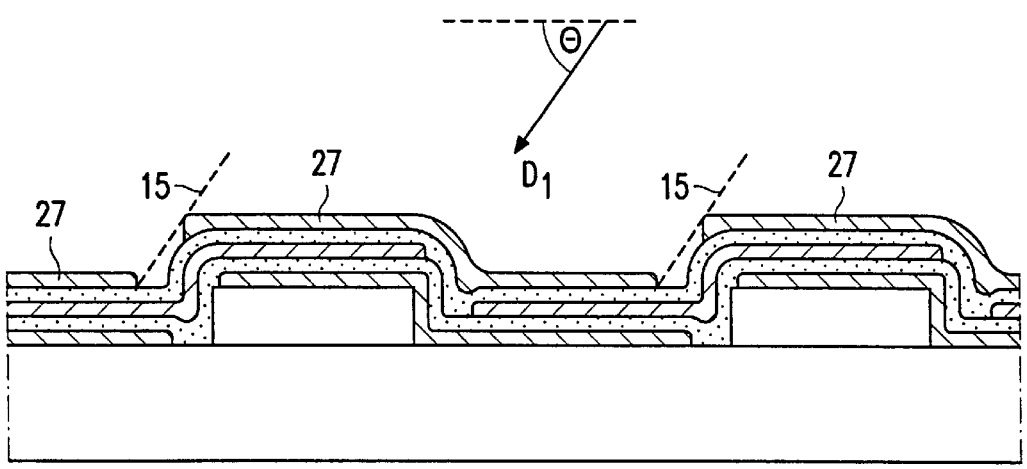
FIG. 7 illustrates the structure of FIG. 6 subsequent to the non-perpendicular deposition thereupon of a third electrically conductive layer.
Figure 8:
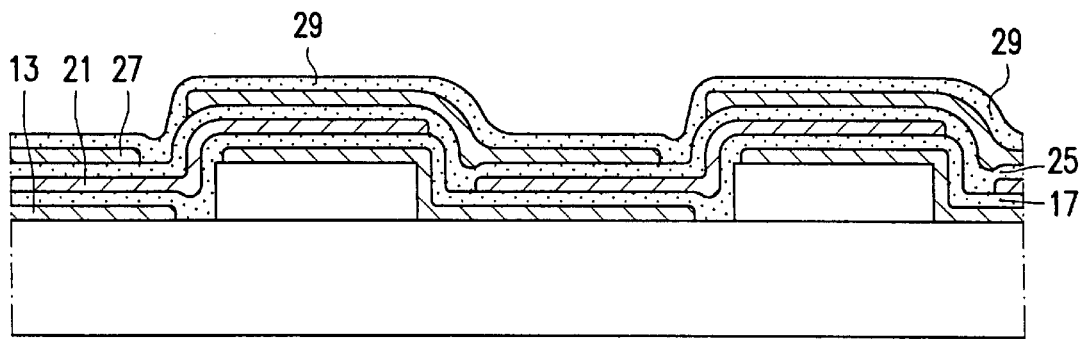
FIG. 8 shows the structure of FIG. 7 subsequent to its coverage with a third electrically insulating layer.

The process steps shown in FIGS. 3 and 4 are repeated in succession in FIGS. 7 and 8, respectively, which depict the consecutive provision of a conductive layer 27 (deposited from the direction $D_1$) and an insulating layer 29. If so desired, further layers can then be provided by repeating the process steps depicted in FIGS. 5 and 6, and so forth.

Figure 9:
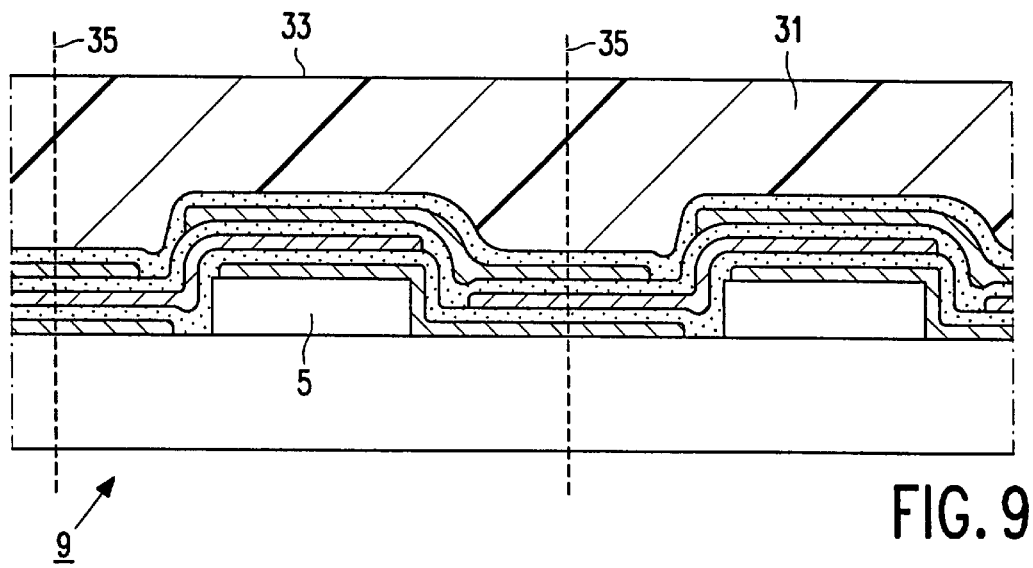
FIG. 9 depicts the structure of FIG. 8 after its coverage with a blanketing layer of electrically insulating material.

In FIG. 9, the structure of FIG. 8 has been covered with a blanketing layer 31 of insulating material. Such material may, for example, comprise a photo-curable resin, which is spin-coated onto the substrate 9 and then hardened, or a glass-based paste, which is raked onto the substrate 9 and then dried. In any case, the layer 31 serves to fill in the periodic depressions (valleys) in the multilayer structure of FIG. 8, thereby giving rise to a relatively smooth top face 33.

Also depicted in FIG. 9 are planes 35 which run substantially perpendicular to the top face 33 (and to the plane of the substrate 9). These severing planes extend into the Figure in a perpendicular direction, so that they in fact run along the length of the valleys 7 in FIG. 2, in a direction substantially parallel to the elongated surface protrusions 5.

Figure 10:
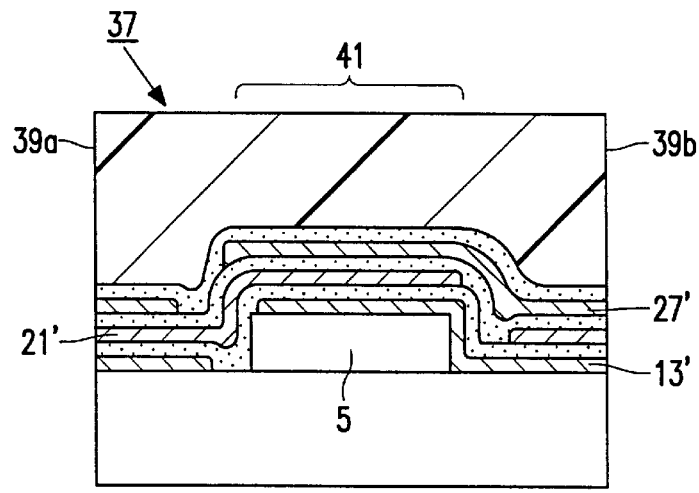
FIG. 10 shows a strip-like part of the structure of FIG. 9, obtained via a severing procedure.

FIG. 10 shows a strip 37 obtained from the subject of FIG. 9 by severing it along the planes 35 (using, for example, a wire saw). The strip 37 has exposed side faces 39a, 39b corresponding to the severing planes 35 in FIG. 9. The electrically conductive layers 21'; 13',27' mutually overlap in the region 41 above the protrusion 5, and terminate in the respective exposed side faces 39a; 39b. The strip 37 has a width of 1 mm, a height of 1 mm and a length of 100 mm, approximately.

Figure 11:
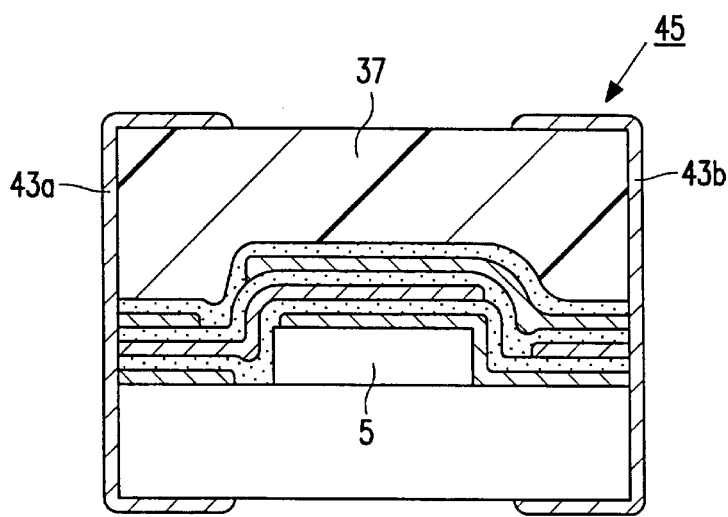
FIG. 11 shows the strip-like part of FIG. 10, after the provision thereupon of electrical contacts.

In FIG. 11, the strip 37 of FIG. 10 has been provided with electrical contacts 43a, 43b on the respective exposed side faces 39a, 39b. Such contacts 43a, 43b can be provided, for example, by dipping each side 39a, 39b of the strip 37 into a metallisation bath (comprising a silver-palladium ink, for example). The cap-like contacts 43a, 43b thus formed make the strip 37 suitable for surface-mounting on a printed circuit board, for example.

In principle, the resulting component 45 may be used as a multilayer capacitor, since it comprises alternately stacked layers of metallic and dielectric material (e.g. Al and $SiO_2$, respectively), and consecutive conductive layers 21'; 13',27' are alternately connected to opposite electrical contacts 43a; 43b. In practice, however, the elongated component 45 will be divided into a number of smaller blocks (not depicted) by severing the component 45 at various points along its length (using a wire saw, for example). Such blocks may have a typical length of the order of 2 mm, for example, and are directly usable as capacitors (having a smaller capacitance value than the component 45, of course).

Embodiment 2

If, in Embodiment 1, the electrically insulating layers 17, 25, 29 comprise a piezoelectric material such as doped $BaTiO_3$ or $PbTiO_3$ (with a perovskite structure), then the resulting electronic component 45 may be used as a multilayer piezoelectric actuator.

Embodiment 3

Figure 12:
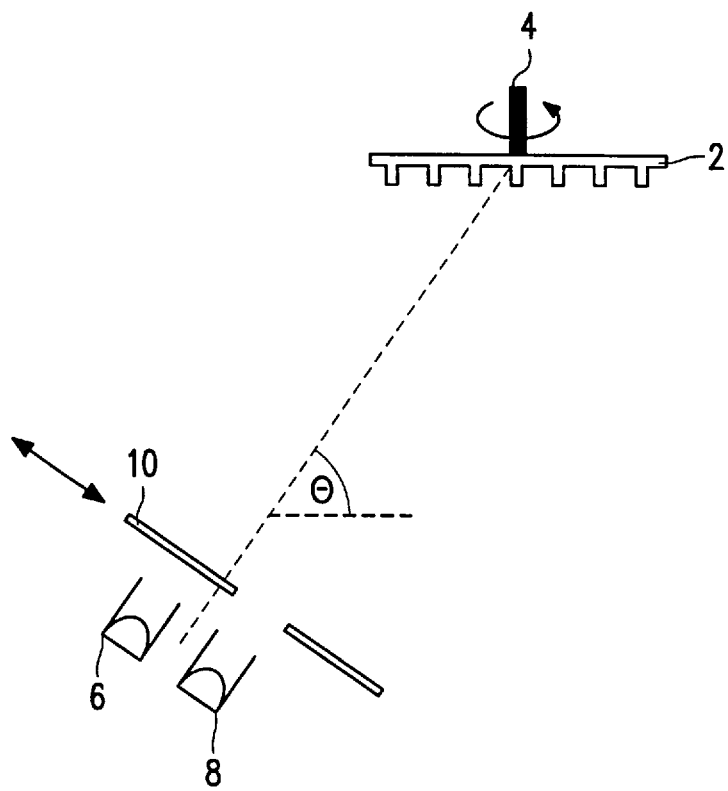
FIG. 12 shows an exemplary deposition geometry for enaction of the inventive method.

FIG. 12 depicts a simple deposition geometry with which the inventive method can be enacted.

A substrate 2, with the required pattern of surface protrusions on one face, is mounted so as to be rotatable about an axis 4 perpendicular to its plane. This substrate 2 can be accessed by the depository flux from either of two sources 6, 8, which are located side by side. The source 6 contains electrically insulating material, whereas the source 8 contains electrically conductive material. Each of the sources 6, 8 is thus oriented that the direction of its depository flux subtends an angle θ with the plane of the substrate 2.

A moveable shutter 10 is used to ensure that, at any given time, only the flux from one of the sources 6, 8 can reach the substrate 2. When depositing from source 6, the substrate 2 is continually rotated about the axis 4, so as to ensure continuous coverage of the substrate surface with insulating material. On the other hand, when depositing from source 8, the substrate 2 is kept stationary. However, between successive depositions from source 8, the substrate 2 is rotated through an angle of 180°.

We claim:

1. A method of manufacturing a plurality of electronic multilayer components, each of which comprises alternately stacked electrically conductive and electrically insulating layers, the electrically conductive layers being electrically connected in a periodically alternate arrangement to substantially opposite edges of the multilayer component, said method comprising the following steps:

(a) providing a substrate which is endowed on one face with a regular pattern of substantially parallel elongated surface protrusions separated by intervening valleys;

(b) providing a flux of electrically conductive material in a direction $D_1$ subtending an angle of less than 90° with the substrate face and extending substantially perpendicular to the surface protrusions, and subsequently covering the electrically conductive layer thus formed with an electrically insulating layer;

(c) providing a flux of electrically conductive material in a direction $D_2$ subtending an angle of less than 90° with the substrate face and having an in-plane component which is directed substantially opposite to the in-plane component of direction $D_1$, and subsequently covering the electrically conducting layer thus formed with an electrically insulating layer;

(d) repeating steps (b) and (c), in alternation, and finishing with step (b) or (c), as desired;

(e) dividing the substrate into strips, each strip including a surface protrusion, by severing the substrate along a series of planes, each plane extending along a valley in a direction substantially parallel to the surface protrusions, each strip thus acquiring an exposed side face running along each of the two planes defining the strip; and (f) providing electrically conductive material upon each exposed side face, so as to provide mutual electrical contact between the electrically conductive layers terminating in that exposed side face.

2. The method according to claim 1, wherein the regular pattern of substantially parallel elongated surface protrusions separated by intervening valleys is formed by patternwise selective removal of substrate material with the aid of an etching technique.

3. The method according to claim 1, wherein the electrically insulating layers are deposited by providing a flux of electrically insulating material in a direction subtending an angle of less than 90° with the substrate face, while simultaneously rotating the substrate about an axis substantially perpendicular to its plane.

4. The method according to claim 1, wherein dividing the substrate into strips comprises a technique selected from the group consisting of sawing and laser scribing.

5. The method according to claim 1, wherein providing electrically conductive material upon each exposed side face comprises dipping the exposed side face along each elongated edge into a metallisation bath of conductive ink.

6. The method according to claim 1, wherein after providing electrically conductive material upon each exposed side face, at least one of the strips is divided into smaller portions by severing it at one or more positions along its length.

7. The method according to claim 2, wherein the electrically insulating layers are deposited by providing a flux of electrically insulating material in a direction subtending an angle of less than 90° with the substrate face, while simultaneously rotating the substrate about an axis substantially perpendicular to its plane.

8. The method according to claim 2, wherein dividing the substrate into strips comprises a technique selected from the group consisting of sawing and laser scribing.

9. The method according to claim 3, wherein dividing the substrate into strips comprises a technique selected from the group consisting of sawing and laser scribing.

10. The method according to claim 2, wherein providing electrically conductive material upon each exposed side face comprises dipping the exposed side face along each elongated edge into a metallisation bath of conductive ink.

11. The method according to claim 3, wherein providing electrically conductive material upon each exposed side face comprises dipping the exposed side face along each elongated edge into a metallisation bath of conductive ink.

12. The method according to claim 4, wherein providing electrically conductive material upon each exposed side face comprises dipping the exposed side face along each elongated edge into a metallisation bath of conductive ink.

13. The method according to claim 2, wherein after providing electrically conductive material upon each exposed side face, at least one of the strips is divided into smaller portions by severing it at one or more positions along its length.

14. The method according to claim 3, wherein after providing electrically conductive material upon each exposed side face, at least one of the strips is divided into smaller portions by severing it at one or more positions along its length.

15. The method according to claim 4, wherein after providing electrically conductive material upon each exposed side face, at least one of the strips is divided into smaller portions by severing it at one or more positions along its length.

16. The method according to claim 5, wherein after providing electrically conductive material upon each exposed side face, at least one of the strips is divided into smaller portions by severing it at one or more positions along its length.

* * * * *